United States Patent
Kim et al.

(10) Patent No.: US 9,165,977 B2
(45) Date of Patent: Oct. 20, 2015

(54) LIGHT EMITTING DEVICE AND LIGHT EMITTING DEVICE PACKAGE INCLUDING SERIES OF LIGHT EMITTING REGIONS

(71) Applicant: LG INNOTEK CO., LTD., Seoul (KR)

(72) Inventors: Sung Kyoon Kim, Seoul (KR); Hyun Seoung Ju, Seoul (KR); Gi Seok Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 217 days.

(21) Appl. No.: 13/662,348

(22) Filed: Oct. 26, 2012

(65) Prior Publication Data
US 2013/0105845 A1   May 2, 2013

(30) Foreign Application Priority Data
Oct. 28, 2011 (KR) .................. 10-2011-0111308

(51) Int. Cl.
| | |
|---|---|
| H01L 33/60 | (2010.01) |
| H01L 27/15 | (2006.01) |
| H01L 33/38 | (2010.01) |
| H01L 33/46 | (2010.01) |

(52) U.S. Cl.
CPC ............ H01L 27/156 (2013.01); *H01L 33/382* (2013.01); *H01L 33/46* (2013.01); *H01L 2224/13* (2013.01)

(58) Field of Classification Search
CPC ...... H01L 33/46; H01L 33/382; H01L 27/156
USPC ............... 257/88–93; 315/184, 185 R
See application file for complete search history.

(56) References Cited

U.S. PATENT DOCUMENTS

| | | | |
|---|---|---|---|
| 2010/0102732 A1* | 4/2010 | Peeters et al. | 315/161 |
| 2010/0213474 A1* | 8/2010 | Hsu et al. | 257/89 |
| 2010/0252840 A1* | 10/2010 | Ibbetson et al. | 257/88 |
| 2011/0084294 A1 | 4/2011 | Yao | |
| 2012/0043563 A1* | 2/2012 | Ibbetson et al. | 257/88 |
| 2012/0187424 A1* | 7/2012 | Kim et al. | 257/88 |
| 2012/0228580 A1* | 9/2012 | Wang et al. | 257/13 |
| 2013/0161655 A1* | 6/2013 | Xu et al. | 257/88 |
| 2013/0273673 A1* | 10/2013 | Hsu et al. | 438/16 |

FOREIGN PATENT DOCUMENTS

| | | |
|---|---|---|
| EP | 2 341 543 A1 | 7/2011 |
| WO | WO 2005/062389 A2 | 7/2005 |
| WO | WO 2011/126248 A2 | 10/2011 |

* cited by examiner

*Primary Examiner* — Peter Bradford
(74) *Attorney, Agent, or Firm* — Birch, Stewart, Kolasch & Birch, LLP

(57) ABSTRACT

Disclosed is a light emitting device including a light emitting structure including a plurality of light emitting regions comprising a first semiconductor layer, an active layer and a second semiconductor layer, a first distributed bragg reflective layer disposed on the light emitting regions, a first electrode unit disposed on the first semiconductor layer in one of the light emitting regions, a second electrode unit disposed on the second semiconductor layer in another of the light emitting regions, an intermediate pad disposed on the first semiconductor layer or the second semiconductor layer in at least still another of the light emitting regions, and at least one connection electrode disposed on the first distributed bragg reflective layer such that the connection electrode sequentially connects the light emitting regions in series.

20 Claims, 17 Drawing Sheets

LIGHT EMITTING DEVICE AND LIGHT EMITTING DEVICE PACKAGE INCLUDING SERIES OF LIGHT EMITTING REGIONS

CROSS REFERENCE TO RELATED APPLICATION

This application claims priority under 35 U.S.C. §119 to Korean Patent Application No. 10-2011-0111308, filed in Korea on 28 Oct. 2011, which is hereby incorporated in its entirety by reference as if fully set forth herein.

TECHNICAL FIELD

Embodiments relate to a light emitting device, a light emitting device package, a lighting apparatus, and a display apparatus.

BACKGROUND

Red, green and blue light emitting diodes (LED) capable of realizing high luminance and white light were developed, based on development of metal organic chemical vapor deposition and molecular beam growth of gallium nitride (GaN).

Such LEDs do not contain environmentally harmful substances such as mercury (Hg) used in conventional lighting apparatuses such as incandescent lamps or fluorescent lamps and thus advantageously have superior eco-friendliness, long lifespan and low power consumption, thus being used as alternatives of conventional light sources. The key factors in competitiveness of such LEDs are to realize high luminance, based on chips with high efficiency and high power and packaging technologies.

In order to realize high luminance, an increase in light extraction efficiency is important. A variety of methods using flip-chip structures, surface texturing, patterned sapphire substrates (PSSs), photonic crystal techniques, anti-reflective layer structures and the like are being researched in order to increase light extraction efficiency.

In general, a light emitting device may include: a light emitting structure including a first conductive type semiconductor layer, an active layer and a second conductive type semiconductor layer disposed on a substrate; a first electrode to supply a first power to the first conductive type semiconductor layer; and a second electrode to supply a second power to the second conductive type semiconductor layer.

SUMMARY

Embodiments provide a light emitting device and a light emitting device package that have improved light emission efficiency and prevent electrodes from being detached or damaged.

In one embodiment, a light emitting device includes: a light emitting structure includes a plurality of light emitting regions including a first semiconductor layer, an active layer and a second semiconductor layer; a first distributed bragg reflective layer disposed on the light emitting regions; a first electrode unit disposed on the first semiconductor layer in one of the light emitting regions; a second electrode unit disposed on the second semiconductor layer in another of the light emitting regions; an intermediate pad disposed on the second semiconductor layer in at least still another of the light emitting regions; and at least one connection electrode disposed on the first distributed bragg reflective layer such that the connection electrode sequentially connects the light emitting regions in series.

In another embodiment, a light emitting device includes: a light emitting structure including a plurality of light emitting regions including a first semiconductor layer, an active layer and a second semiconductor layer; a first distributed bragg reflective layer disposed on the light emitting regions; a first electrode unit disposed on the first semiconductor layer in one of the light emitting regions; a second electrode unit disposed on the second semiconductor layer in another of the light emitting regions; an intermediate pad disposed on the first semiconductor layer in at least still another of the light emitting regions; and at least one connection electrode disposed on the first distributed bragg reflective layer such that connection electrode sequentially connects the light emitting regions in series.

The connection electrode electrically may connect the first semiconductor layer of one of adjacent light emitting regions to the second semiconductor layer of the other thereof.

Each of the first electrode unit and the second electrode unit may include a pad that receives a power.

The intermediate pad may be electrically connected to the connection electrode disposed in the same light emitting region. The intermediate pad may be separated from the connection electrode, on the first distributed bragg reflective layer in the same light emitting region. Alternatively, the intermediate pad may be integrated with the connection electrode, on the first distributed bragg reflective layer in the same light emitting region.

The connection electrode may include: a first portion that passes through the first distributed bragg reflective layer and contacts the second semiconductor layer in one of the adjacent light emitting regions; and a second portion that passes through the first distributed bragg reflective layer, the second semiconductor layer and the active layer, and contacts the first semiconductor layer in the other of the adjacent light emitting regions, wherein the first distributed bragg reflective layer is disposed between the second portion and the second semiconductor layer, and between the second portion and the active layer.

The light emitting device may further include: a substrate disposed under the light emitting structure; and a conductive layer disposed between the light emitting region and the first distributed bragg reflective layer.

The second portion of the connection electrode may pass through the conductive layer. The first distributed bragg reflective layer may be disposed between the connection electrode and the conductive layer.

The light emitting device may further include a second distributed bragg reflective layer disposed on the first distributed bragg reflective layer, the second distributed bragg reflective layer covering the connection electrode.

The second distributed bragg reflective layer may expose the first electrode unit, the second electrode unit and the intermediate pad.

Each of the first distributed bragg reflective layer and the second distributed bragg reflective layer may include an insulator and include at least one first layer and at least one second layer alternately stacked at least one time, wherein a refractive index of the first layer is different from that of the second layer.

The first electrode unit may receive a first power and at least one of the intermediate pad and the second electrode unit may receive a second power.

At least one of the intermediate pad and the first electrode unit may receive a first power and the second electrode unit may receive a second power.

In another embodiment, a light emitting device package includes: a submount; a first metal layer and a second metal layer spaced from each other on the submount; the light emitting device according to claim 1 or 2 disposed on the submount; and a first bump unit and a second bump unit to electrically connect the light emitting device to the submount, wherein the first bump unit electrically connects the first metal layer to the first electrode unit of the light emitting device, and the second bump unit electrically connects the second metal layer to one of the second electrode unit and the intermediate pad of the light emitting device.

The first bump unit may include: a first bumper disposed between the first metal layer and the first electrode unit; a first anti-diffusion bonding layer disposed between the first bumper and the first electrode unit; and a second anti-diffusion bonding layer disposed between the first bumper and the first metal layer, and the second bump unit includes: a second bumper disposed between the second metal layer and one of the second electrode unit and the intermediate pad; a third anti-diffusion bonding layer disposed between the second bumper, and one of the second electrode unit and the intermediate pad; and a fourth anti-diffusion bonding layer disposed between the second bumper and the second metal layer.

The light emitting device package may further include a second distributed bragg reflective layer disposed on the first distributed bragg reflective layer, the second distributed bragg reflective layer covering the connection electrode.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
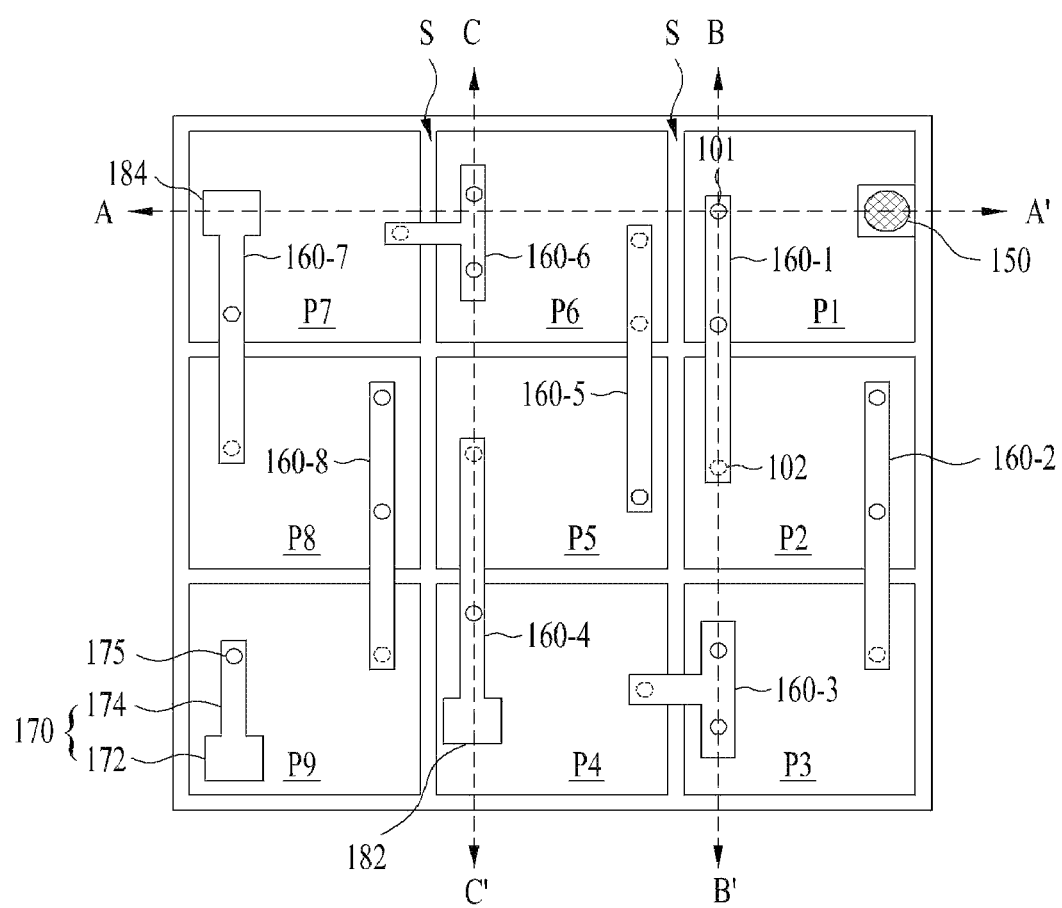
FIG. 1 is a plan view illustrating a light emitting device according to a first embodiment.

Hereinafter, embodiments will be clearly understood from description with reference to the annexed drawings.

It will be understood that when an element is referred to as being "on" or "under" another element, it can be directly on/under the element, and one or more intervening elements may also be present. When an element is referred to as being 'on' or 'under', 'under the element' as well as 'on the element' can be included based on the element.

In the drawings, the thickness or size of each layer is exaggerated, omitted, or schematically illustrated for convenience of description and clarity. Also, the size or area of each constituent element does not entirely reflect the actual size thereof. Hereinafter, a light emitting device, a method for manufacturing the same and a light emitting package including the light emitting device according to embodiments will be described with reference to the annexed drawings.

Figure 2:
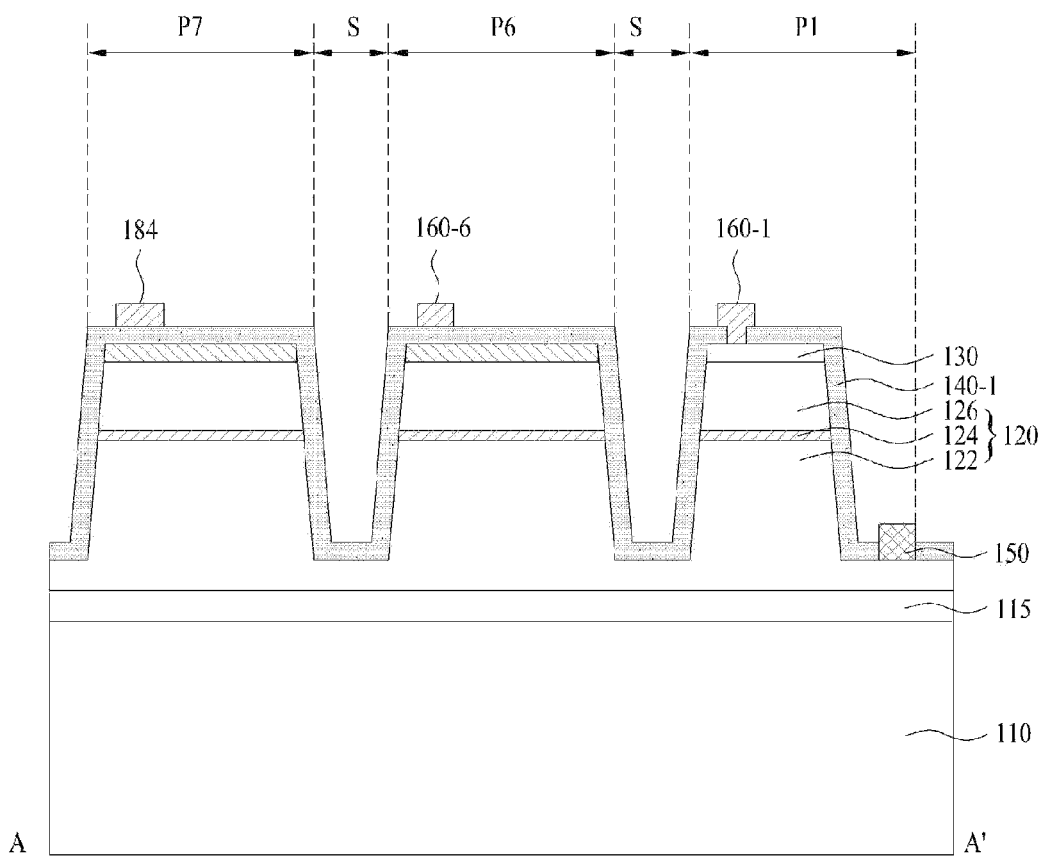
FIG. 2 is a sectional view taken along a direction of AA' of the light emitting device illustrated in FIG. 1.
Figure 3:
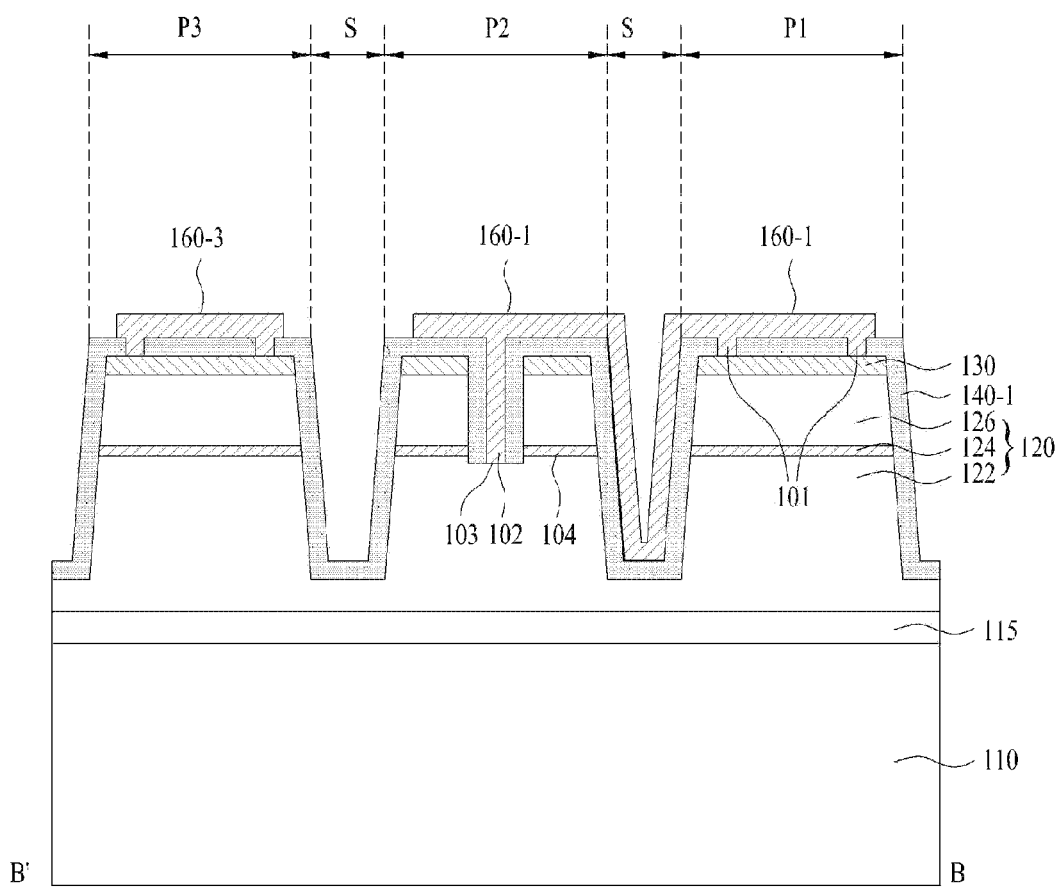
FIG. 3 is a sectional view taken along a direction of BB' of the light emitting device illustrated in FIG. 1.
Figure 4:
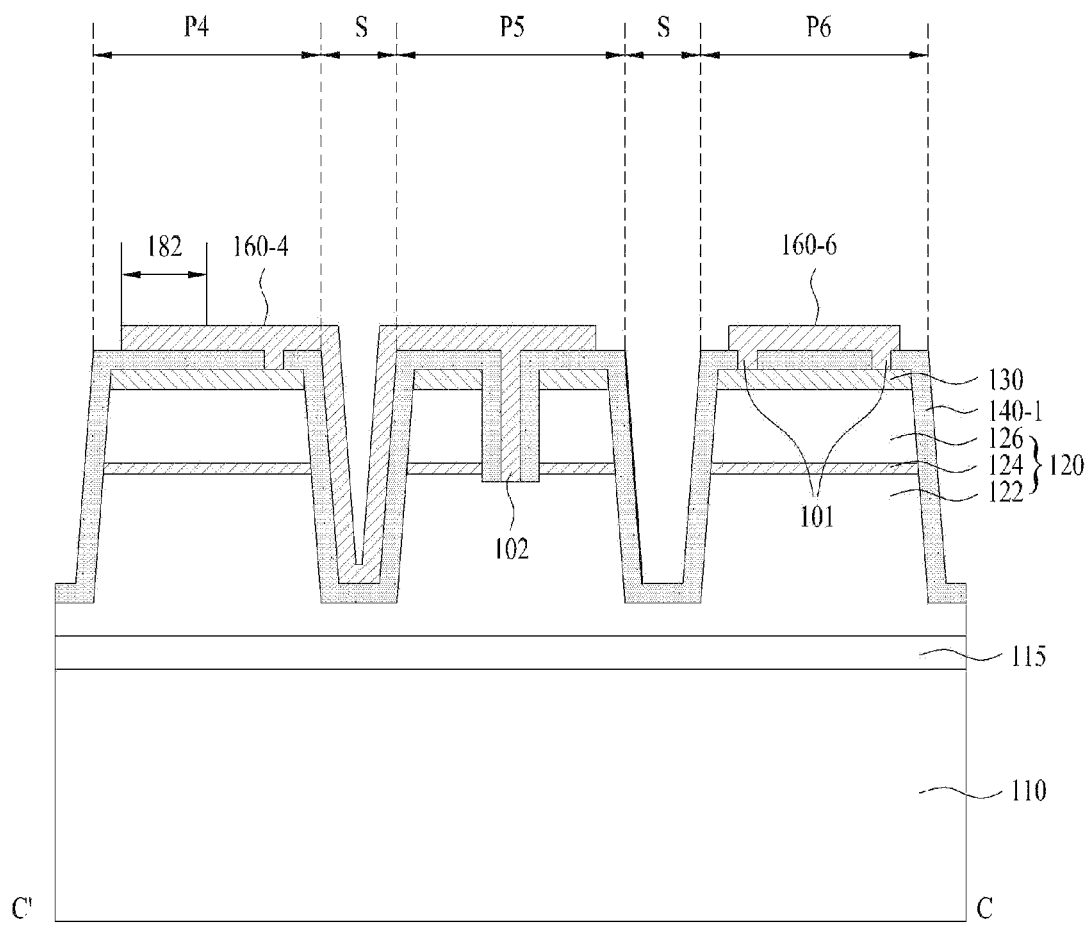
FIG. 4 is a sectional view taken along a direction of CC' of the light emitting device illustrated in FIG. 1.

FIG. 1 is a plan view illustrating a light emitting device 100 according to a first embodiment. FIG. 2 is a sectional view taken along a direction of AA' of the light emitting device 100 illustrated in FIG. 1. FIG. 3 is a sectional view taken along a direction of BB' of the light emitting device 100 illustrated in FIG. 1. FIG. 4 is a sectional view taken along a direction of CC' of the light emitting device 100 illustrated in FIG. 1

Referring to FIGS. 1 to 4, the light emitting device 100 includes a substrate 110, a buffer layer 115, a light emitting structure 120 divided into a plurality of light emitting regions P1 to Pn (in which n is a natural number greater than 1), a conductive layer 130, a distributed bragg reflective layer 140-1, a first electrode unit 150, at least one connection electrode 160-1 to 160-$m$ (in which m is a natural number of 1 or more), at least one intermediate pad 182 and 184, and a second electrode unit 170.

The substrate 110 may be formed with a carrier wafer, a material suitable for growth of semiconductor materials. In addition, the substrate 110 may be formed with a highly thermo-conductive material and may be a conductive substrate or an insulating substrate. For example, the substrate 110 may contain at least one of sapphire ($Al_2O_3$), GaN, SiC, ZnO, Si, GaP, InP, $Ga_2O_3$, and GaAs. A upper surface of the substrate 110 may be provided with a roughness pattern.

The buffer layer 115 is interposed between the substrate 110 and the light emitting structure 120 and may be formed with a Group III-V compound semiconductor. The buffer layer 115 functions to reduce difference in lattice constant between the substrate 110 and the light emitting structure 120.

The light emitting structure 120 may be a semiconductor layer generating light and include a first conductive type semiconductor layer 122, an active layer 124, and a second conductive type semiconductor layer 126. The light emitting structure 120 may have a structure including the first conductive type semiconductor layer 122, the active layer 124, and the second conductive type semiconductor layer 126 sequentially stacked on the substrate 110.

The first conductive type semiconductor layer 122 may be formed with a semiconductor compound. The first conductive type semiconductor layer 122 may be realized with a Group III-V or Group II-VI compound semiconductor or the like, and may be doped with a first conductive dopant.

For example, the first conductive type semiconductor layer 122 may be a semiconductor having a compositional formula of $In_xAl_yGa_{1-x-y}N$ ($0 \leq x \leq 1$, $0 \leq y \leq 1$, $0 \leq x+y \leq 1$). For example, the first conductive type semiconductor layer 122 may contain any one of InAlGaN, GaN, AlGaN, InGaN, AlN, and InN and may be doped with an n-type dopant (for example, Si, Ge, or Sn).

The active layer 124 is interposed between the first conductive type semiconductor layer 122 and the second conductive type semiconductor layer 126, and may generate light through energy generated during recombination of electrons and holes supplied from the first conductive type semiconductor layer 122 and the second conductive type semiconductor layer 126, respectively.

The active layer 124 may be formed with a semiconductor compound, for example, a Group III-V or Group II-VI compound semiconductor, and may have a double-junction structure, a single well structure, a multiple well structure, a quantum wire structure or a quantum dot structure.

When the active layer 124 is a single well structure or a quantum well structure, it may include a well layer having a compositional formula of $In_xAl_yGa_{1-x-y}N$ ($0 \leq x \leq 1$, $0 \leq y \leq 1$, $0 \leq x+y \leq 1$) and a barrier layer having a compositional formula of $In_aAl_bGa_{1-a-b}N$ ($0 \leq a \leq 1$, $0 \leq b \leq 1$, $0 \leq a \leq 1$, $0 \leq a+b \leq 1$). The well layer may be made of a material having a lower band gap than that of the barrier layer.

The second conductive type semiconductor layer 126 may be formed with a semiconductor compound. The second conductive type semiconductor layer 126 may be realized with a Group III-V or Group II-VI compound semiconductor and be doped with a second conductive dopant.

For example, the second conductive type semiconductor layer 126 may be a semiconductor having a compositional formula of $In_xAl_yGa_{1-x-y}N$ ($0 \leq x \leq 1$, $0 \leq y \leq 1$, $0 \leq x+y \leq 1$). For example, the second conductive type semiconductor layer 126 may contain any one of GaN, AlN, AlGaN, InGaN, InN, InAlGaN, AlInN, AlGaAs, GaP, GaAs, GaAsP, and AlGaInP and be doped with a p-type dopant (for example, Mg, Zn, Ca, Sr, or Ba).

The light emitting structure 120 may expose a part of the first conductive type semiconductor layer 122. That is, the light emitting structure 120 may expose a part of the first conductive type semiconductor layer 122 by etching the second conductive type semiconductor layer 126, the active layer 124 and a part of the first conductive type semiconductor layer 122. In this case, the surface of the first conductive type semiconductor layer 122 exposed by mesa-etching may be positioned to be lower than the lower surface of the active layer 124.

A conductive clad layer (not shown) may be interposed between the active layer 124 and the first conductive type semiconductor layer 122, or between the active layer 124 and the second conductive type semiconductor layer 126 and the conductive clad layer may be formed with a nitride semiconductor (for example, AlGaN).

The light emitting structure 120 may further include a third conductive semiconductor layer (not shown) disposed under the second conductive type semiconductor layer 126, and the third conductive semiconductor layer may have an opposite polarity to the second conductive type semiconductor layer 126. The first conductive type semiconductor layer 122 may be realized with an n-type semiconductor layer and the second conductive type semiconductor layer 126 may be realized with a p-type semiconductor layer. Accordingly, the light emitting structure 120 may include at least one of N-P, P-N, N-P-N and P-N-P junction structures.

The light emitting structure 120 may include a plurality of light emitting regions spaced from one another P1 to Pn (in which n is a natural number greater than 1) and at least one boundary region S. The boundary region S may be positioned between the light emitting regions P1 to Pn (in which n is a natural number greater than 1). Alternatively, the boundary region S may be positioned on the circumferences of the light emitting regions P1 to Pn (in which n is a natural number greater than 1). The boundary region S may include a region where a part of the light emitting structure 120 is exposed, formed by mesa-etching the light emitting structure 120, in order to divide the light emitting structure 120 into a plurality of light emitting regions P1 to Pn (in which n is a natural number greater than 1). Areas of the light emitting regions P1 to Pn (n is a natural number greater than 1) may be identical, but the disclosure is not limited thereto.

The light emitting structure 120 of a single chip may be divided into the light emitting regions P1 to Pn (in which n is a natural number greater than 1) through the boundary region S.

The conductive layer 130 is disposed on the second conductive type semiconductor layer 126. The conductive layer 130 reduces total reflection and exhibits superior transmittance, thus increasing an extraction efficiency of light emitted from the active layer 124 to the second conductive type semiconductor layer 126. The conductive layer 130 may be realized with a single or multiple layer structure using one or more transparent oxide substances having high transmittance to light emission wavelengths, such as indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), IrOx, RuOx, RuOx/ITO, Ni, Ag, Ni/IrOx/Au or Ni/IrOx/Au/ITO.

The first distributed bragg reflective layer 140-1 is positioned on the light emitting regions P1 to Pn (in which n is a natural number greater than 1) and the boundary region S. For example, the first distributed bragg reflective layer 140-1 may cover upper parts and sides of the light emitting regions P1 to Pn (in which n is a natural number greater than 1) and cover the boundary region S.

The first distributed bragg reflective layer 140-1 reflects light emitted from the light emitting regions P1 to Pn (in which n is a natural number greater than 1). Accordingly, the first distributed bragg reflective layer 140-1 prevents light from the light emitting regions P1 to Pn (in which n is a natural number greater than 1) from being absorbed by the second electrode unit 170, connection electrodes 160-1 to 160-$n$ (in which n is a natural number greater than 1), and intermediate pads 182 and 184. As a result, in this embodiment, light emission efficiency can be improved.

The first distributed bragg reflective layer 140-1 may have a structure in which at least one first layer and at least one second layer are alternately stacked at least one time, wherein a refractive index of the first layer is different from that of the second layer. The first distributed bragg reflective layer 140-1 may be an electrical insulating material.

For example, the first layer includes a first dielectric layer such as $TiO_2$ and the second layer includes a second dielectric layer such as $SiO_2$. For example, the first distributed bragg reflective layer 140-1 may have a structure in which at least one $TiO_2/SiO_2$ layer is stacked. Each of the first layer and the second layer may have a thickness of $\lambda/4$ in which $\lambda$ is a wavelength of light emitted from the light emitting region. The first electrode unit 150 is disposed on the first conductive type semiconductor layer 122 in any one light emitting region (for example, P1) among the light emitting regions P1 to Pn (for example, n=9) and may contact the first conductive type semiconductor layer 122. The first electrode unit 150 may include a first pad bonded to a wire (not shown) to supply a first power. In the embodiment of FIG. 1, the first electrode unit 150 may serve as the first pad.

The second electrode unit 170 is disposed on the second conductive type semiconductor layer 126 in another light emitting region (for example, P9) among the light emitting regions P1 to Pn (for example, n=9).

The second electrode unit 170 may contact the second conductive type semiconductor layer 126 or the conductive layer 130. For example, the second electrode unit 170 may contact the conductive layer 130 of the last light emitting region (for example, P9) among the light emitting regions connected in series.

The second electrode unit 170 may include a second pad 172 and a branch electrode 174 disposed on the first distributed bragg reflective layer 140-1. The second pad 172 is bonded to a wire (not shown) to supply a second power, and the branch electrode 174 may extend from the second pad 172 and include at least one portion 175 that passes through the first distributed bragg reflective layer 140-1 and contacts the conductive layer 130.

The connection electrodes 160-1 to 160-m (m=8) are disposed on the first distributed bragg reflective layer 140-1 and electrically connect the light emitting regions P1 to Pn (for example, n=9) in series. For example, the connection electrodes 160-1 to 160-m (for example, m=8) connect a plurality of light emitting regions P1 to P9 in series, from a first light emitting region P1, in which the first electrode unit 150 is disposed, as a start point, to the ninth light emitting region P9 in which the second electrode unit 170 is disposed, as an end point.

Each connection electrode (for example, 160-1) may electrically connect the conductive layer 130 of one light emitting region P1 of adjacent light emitting regions (for example, P1 and P2) to the first conductive type semiconductor layer 122 of the other light emitting region (for example, P2) thereof.

In another embodiment excluding the conductive layer 130, the connection electrode (for example, 160-1) may electrically connect the second conductive type semiconductor layer 126 of one light emitting region P1 to the first conductive type semiconductor layer 122 of the other light emitting region (for example, P2).

A plurality of light emitting regions P1 to Pn (in which n is a natural number greater than 1) connected to one another in series included in the light emitting device 100 are referred to as a $1^{st}$ light emitting region to an $n^{th}$ light emitting region in order. That is, the light emitting region in which the first electrode unit 150 is disposed is referred to as a $1^{st}$ light emitting region P1 and the light emitting region in which the second electrode unit 170 is disposed is referred to as an $n^{th}$ light emitting region (Pn). Here, "adjacent light emitting regions" may be a $k^{th}$ light emitting region and a $K+1^{th}$ light emitting region, the $k^{th}$ connection electrode may electrically connect the $k^{th}$ light emitting region to the $K+1^{th}$ light emitting region in series, under a provision of $1 \leq k \leq (n-1)$.

That is, the $k^{th}$ connection electrode may electrically connect the second conductive type semiconductor layer 126 or conductive layer 130 of the $k^{th}$ light emitting region to the first conductive type semiconductor layer 122 of the $k+1^{th}$ light emitting region.

For example, referring to FIG. 3, the $k^{th}$ connection electrode (for example, k=1) may be positioned in the $k^{th}$ light emitting region (for example, k=1), the $k+1^{th}$ light emitting region (for example, k+1=2), and the boundary region S provided therebetween. Also, the $k^{th}$ connection electrode (for example, 160-1) may include at least one first portion (for example, 101) that passes through the first distributed bragg reflective layer 140-1 and contacts the conductive layer 130 (or second conductive type semiconductor layer 126) of the $k^{th}$ light emitting region (for example, P=1). A full-lined circle illustrated in FIG. 1 represents a first portion 101 of connection electrodes 160-1 to 160-m (for example, m=8).

Also, the first distributed bragg reflective layer 140-1 may be disposed between the light emitting structure 120 positioned on the boundary region S and the connection electrode (for example, 160-1).

In addition, the $k^{th}$ connection electrode (for example, 160-1) may include at least one second portion (for example, 102) that passes through the first distributed bragg reflective layer 140-1, the conductive layer 130, the second conductive type semiconductor layer 126, and the active layer 124 of the $k+1^{th}$ light emitting region (for example, P2) and contacts the first conductive type semiconductor layer 122. A dot-lined circle illustrated in FIG. 1 represents the second portion 102 of the connection electrode 160-1 to 160-m (for example, m=8).

In this case, the first distributed bragg reflective layer 140-1 may be disposed between the $k^{th}$ connection electrode (for example, 160-1) and the conductive layer 130, between the second portion 102 of the $k^{th}$ connection electrode (for example, 160-1) and the second conductive type semiconductor layer 126, and between the second portion 102 of the $k^{th}$ connection electrode (for example, 160-1) and the active layer 124.

In general, in order to form an electrode connected to the first conductive type semiconductor layer, mesa etching to expose the first conductive type semiconductor layer by etching the light emitting structure is performed. In general, the light emitting region of the light emitting device is decreased in proportion to the mesh-etched region.

However, the second portion (for example, 102) of the $k^{th}$ connection electrode (for example, 160-1) may have a structure of a hole or groove filled with an electrode material. For this reason, the light emitting region lost by mesa etching is decreased and in this embodiment, a light emitting area may be increased.

The first distributed bragg reflective layer 140-1 functions to electrically insulate the $k^{th}$ connection electrode (for example, 160-1) from the conductive layer 130, the second conductive type semiconductor layer 126 and the active layer 124 of the $k+1^{th}$ light emitting region (for example, P2).

A lower surface 103 of the second portion 102 of the $k^{th}$ connection electrode (for example, 160-1) may be disposed to be lower than a lower surface 104 of the active layer 124. The second portion 102 may have a structure of a hole or groove filled with an electrode material.

The intermediate pads 182 and 184 are disposed on the first distributed bragg reflective layer 140-1 in at least one light emitting region among the light emitting regions P1 to Pn (in which n is a natural number greater than 1) and may be electrically connected to the second conductive type semiconductor layer 126 or the conductive layer 130. The intermediate pads 182 and 184 may be regions bonded to wires to supply a second power.

For example, the intermediate pads 182 and 184 may be disposed on the first distributed bragg reflective layer 140-1 in at least one light emitting region (for example, P4 and P7) among the light emitting regions (for example, P2 to P8), other than light emitting regions (for example, P1 and P9) in which the first electrode unit 150 and the second electrode portion 170 are positioned.

As shown in FIG. 4, the first distributed bragg reflective layer 140-1 is interposed between the intermediate pad 182 or 184, and the conductive layer 130, and the intermediate pad 182 or 184 may be connected to one 160-4 of the connection electrodes (for example, 160-3 and 160-4) disposed in the same light emitting region (for example, P4).

However, in other embodiment, a part of the intermediate pad passes through the first distributed bragg reflective layer and is directly connected to the conductive layer. In this case, the intermediate pad and the connection electrode positioned in the same light emitting region may be connected or may be not connected.

Figure 5:
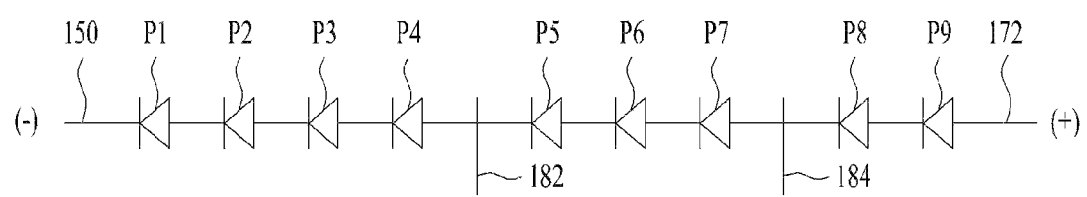
FIG. 5 is a circuit diagram of the light emitting device illustrated in FIG. 1.

FIG. 5 is a circuit diagram of the light emitting device 100 illustrated in FIG. 1. Referring to FIGS. 1 and 5, the light emitting device 100 has a common single (−) terminal, for example, a first pad 150, and two or more (+) terminals, for example, a second pad 172 and at least one intermediate pad 182 or 184.

Accordingly, in this embodiment, the light emitting device includes a plurality of (+) terminals, pads 172, 182 and 184, thus enabling use of various driving voltages and enabling control of emission of light with various brightness levels. For example, in a case in which a driving voltage to drive one light emitting region is 3.4V, when a driving voltage applied to the light emitting device 100 is 13.6V, a second power is applied to the first intermediate pad 182 to drive the first to fourth light emitting regions P1 to P4.

Also, when a driving voltage applied to the light emitting device 100 is 23.8V, a second power is applied to the second intermediate pad 184 to drive the first to seventh light emitting regions P1 to P7. Also, when a driving voltage applied to the light emitting device 100 is 30.6V, a second power is applied to the second pad 172 to drive the first to ninth light emitting regions P1 to P9. This embodiment may be designed such that a part or entirety of light emitting regions is driven by supplying a second power to any one of the intermediate pads 182 and 184, and the second pad 172 according to applied driving voltage.

In addition, in this embodiment, the light emitting area can be increased, current is dispersed and light-emission efficiency can thus be improved, because the connection electrodes 160-1 to 160-$m$ (in which m is a natural number of 1 or more) point-contact the conductive layer 130 or the first conductive type semiconductor layer 122.

The first distributed bragg reflective layer 140-1 prevents absorption and loss of light into the second electrode unit 170, the connection electrodes 160-1 to 160-$m$ (in which m is a natural number of 1 or more), and intermediate pads 182 and 184. As a result, in this embodiment, light emission efficiency can be improved.

Figure 6:
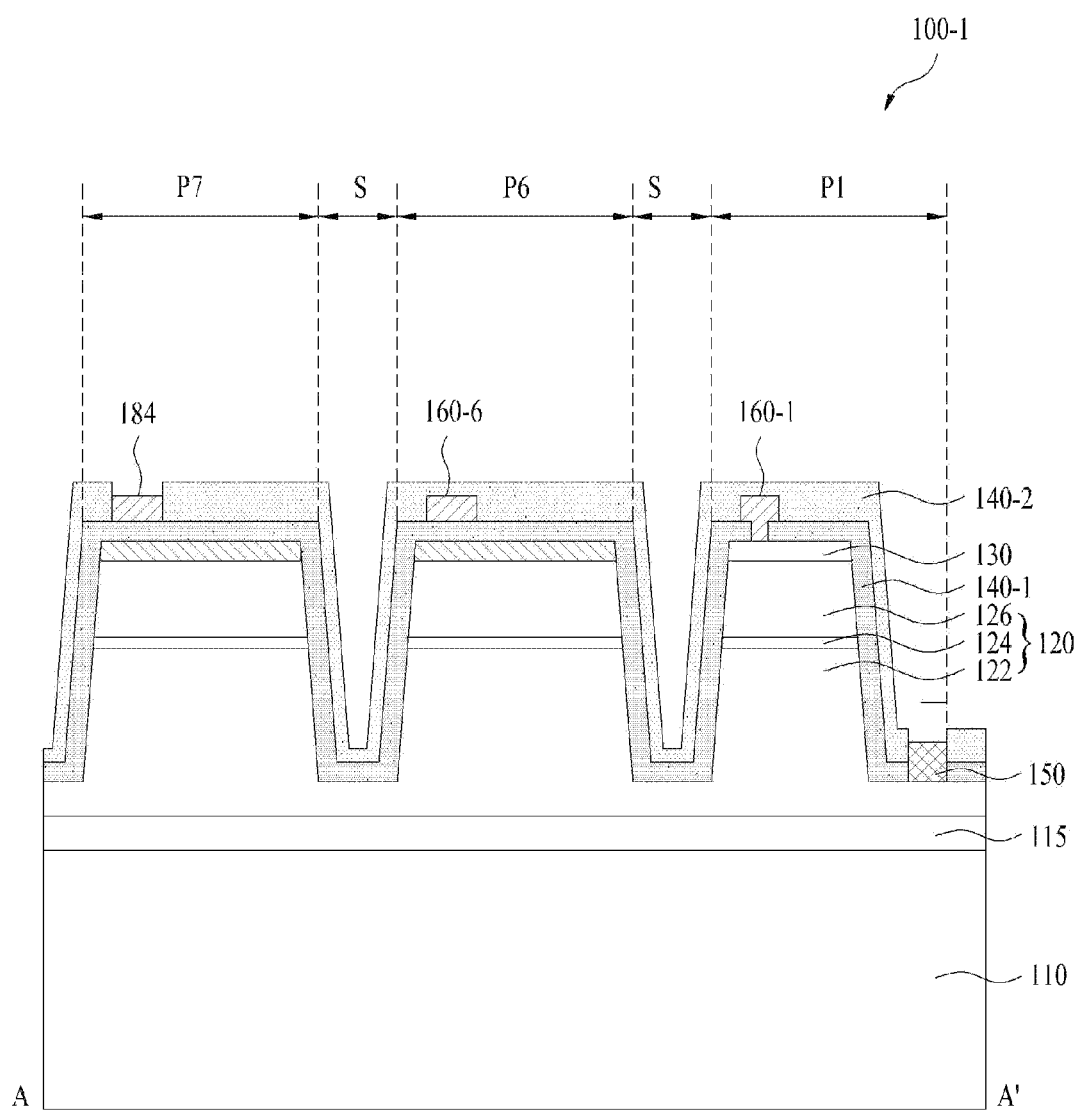
FIGS. 6 to 8 are sectional views illustrating a light emitting device according to a variation embodiment of the first embodiment.
Figure 7:
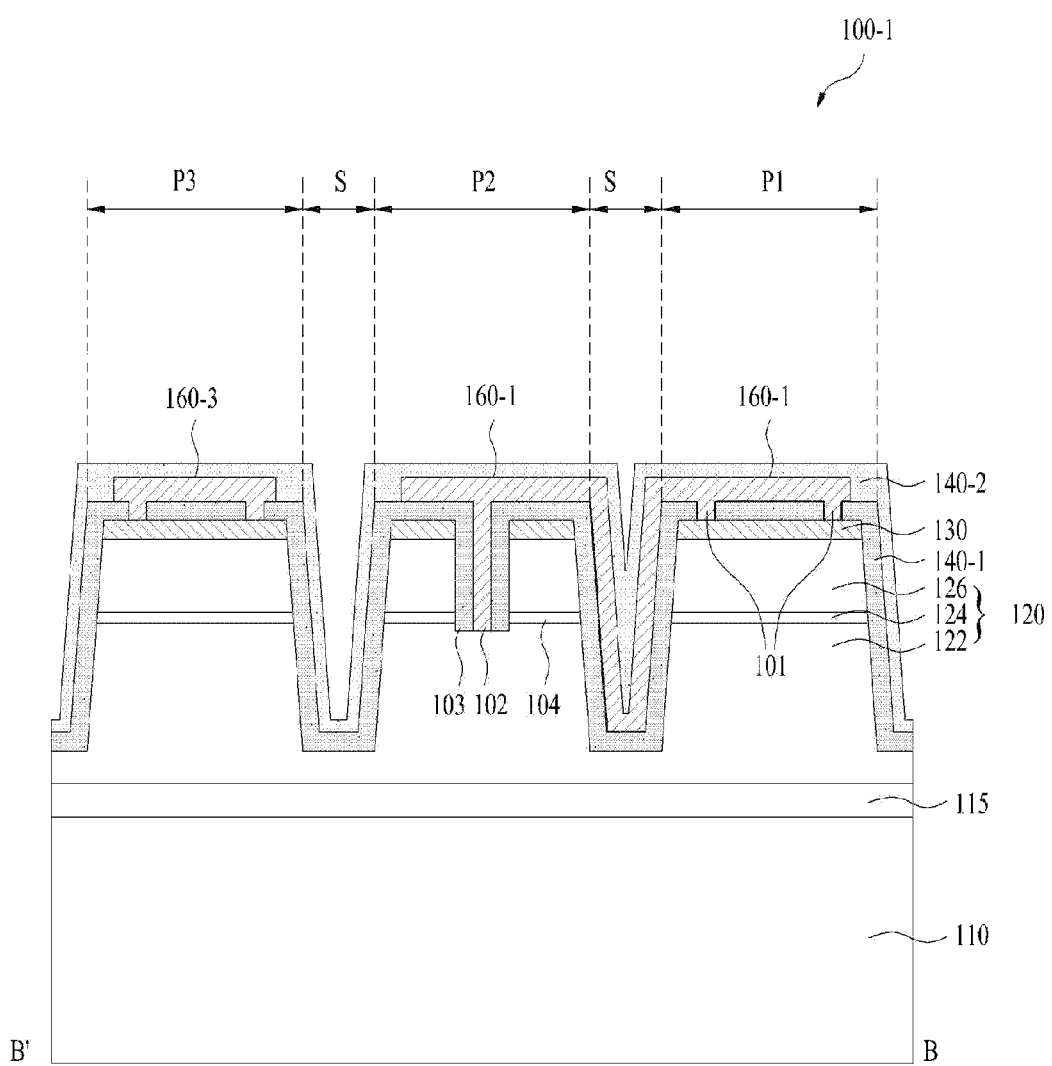
Figure 8:
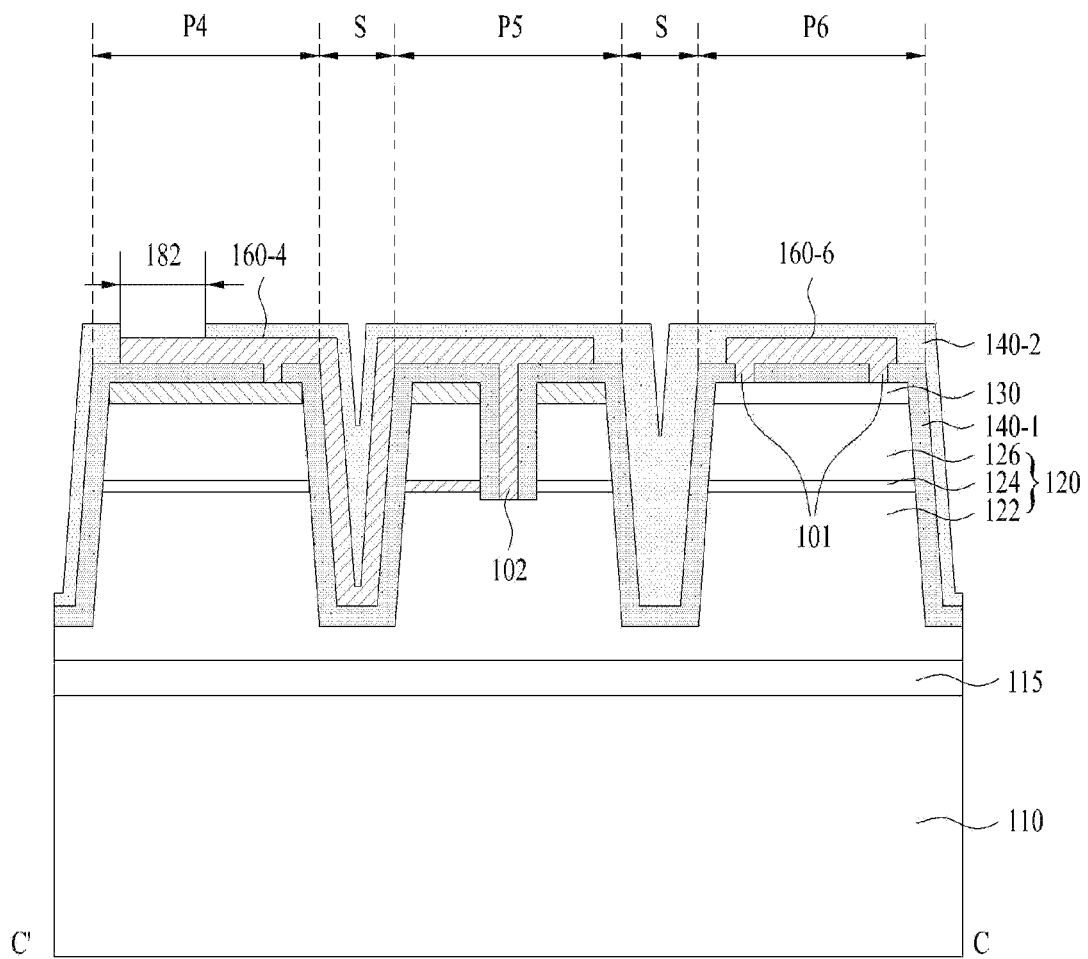

FIGS. 6 to 8 are sectional views illustrating a variation embodiment of the first embodiment. FIG. 6 is a sectional view taken along a direction of AA' of the light emitting device illustrated in FIG. 1. FIG. 7 is a sectional view taken along a direction of BB' of the light emitting device illustrated in FIG. 1. FIG. 8 is a sectional view taken along a direction of CC' of the light emitting device illustrated in FIG. 1. The same drawing reference numerals as in FIGS. 1 to 4 represent the same configuration and the aforementioned descriptions are omitted or summarized.

Referring to FIGS. 6 to 8, the variation embodiment further includes a second distributed bragg reflective layer 140-2, in addition to the first embodiment. The second distributed bragg reflective layer 140-2 is disposed on the first distributed bragg reflective layer and covers connection electrodes 160-1 to 160-$m$ (m is a natural number 1 of more). The second distributed bragg reflective layer 140-2 may expose the first pad of the first electrode unit 150, the second pad 172 of the second electrode unit 170, and the intermediate pads 182 and 184.

The second distributed bragg reflective layer 140-2 may be made of the same material as the first distributed bragg reflective layer 140-1. The second distributed bragg reflective layer 140-2 may prevent connection electrodes 160-1 to 160-$m$ (m is a natural number of 1 or more) from being detached or damaged.

Figure 9:
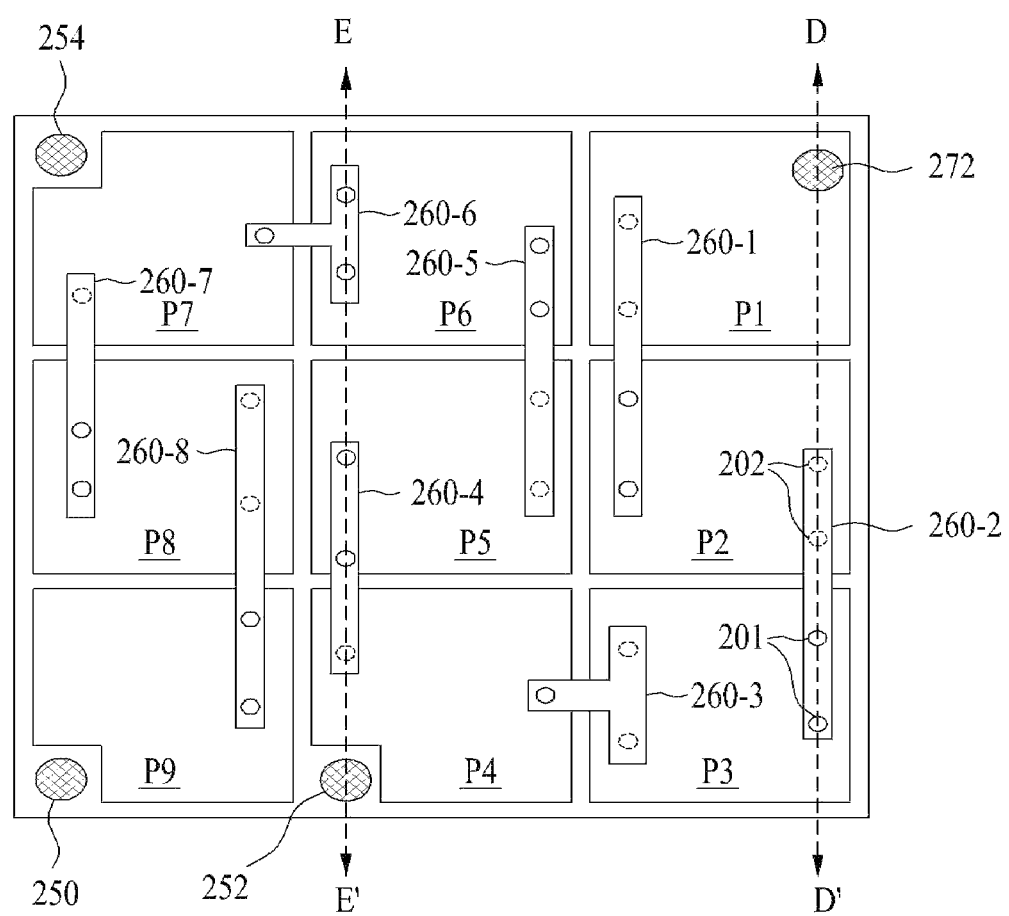
FIG. 9 is a plan view illustrating a light emitting device according to a second embodiment.
Figure 10:
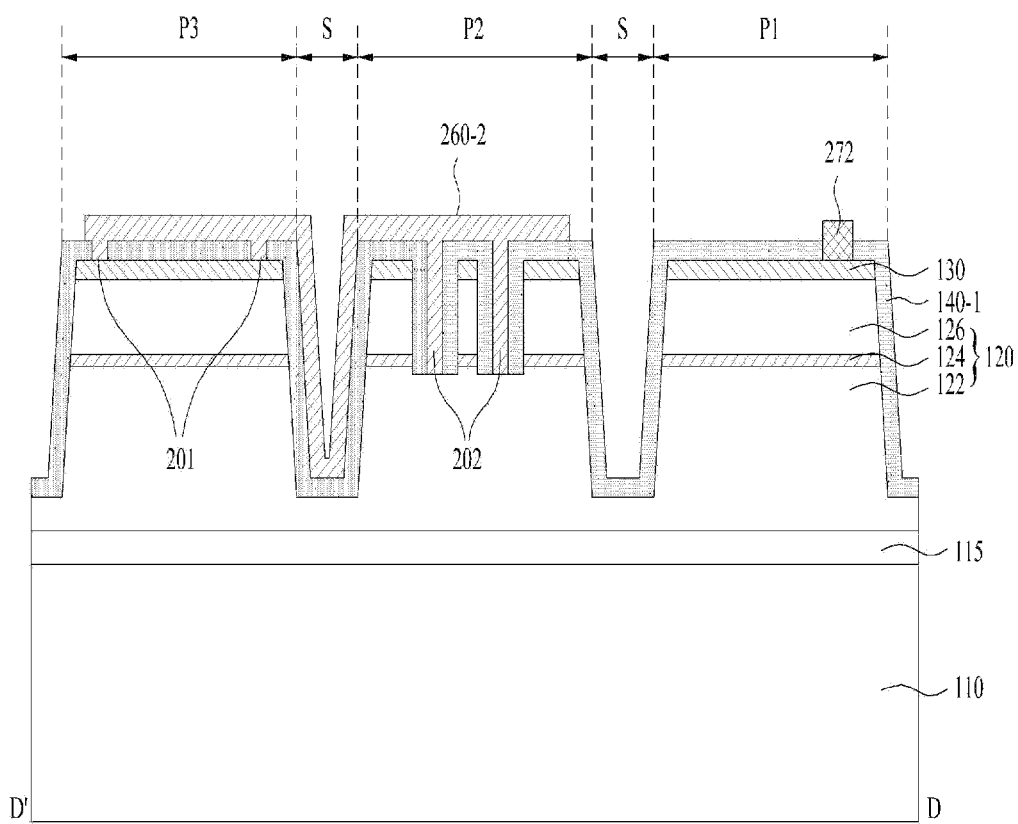
FIG. 10 is a sectional view taken along a direction of DD' of the light emitting device illustrated in FIG. 9.
Figure 11:
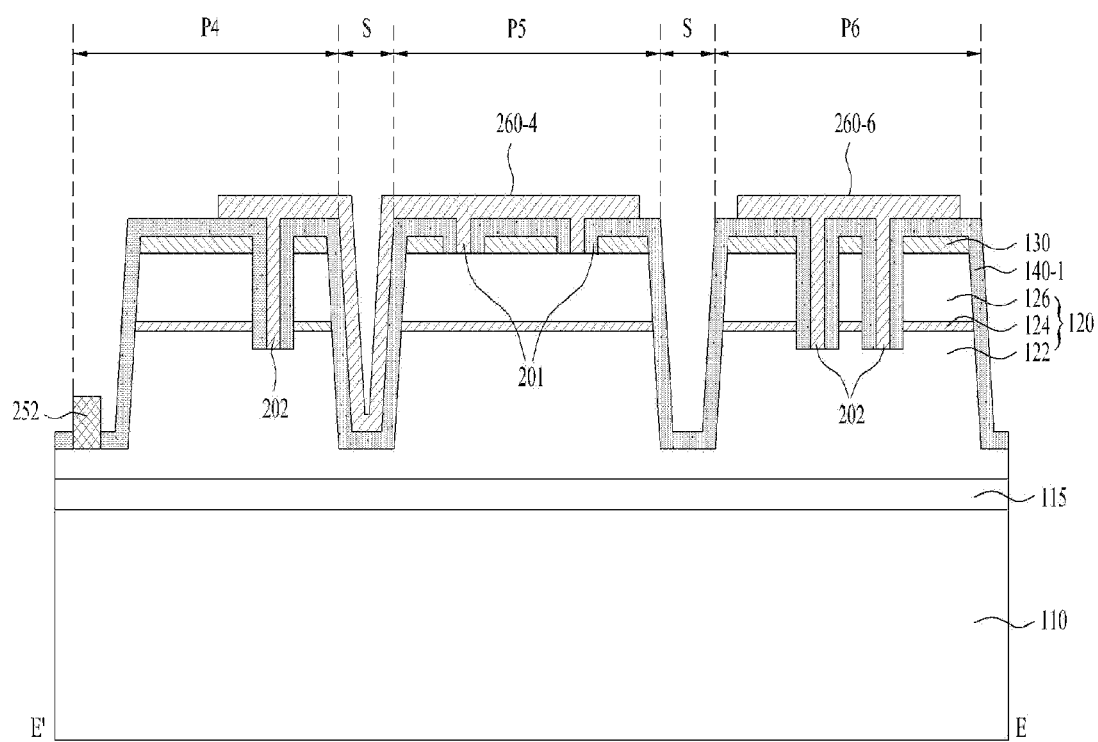
FIG. 11 is a sectional view taken along a direction of EE' of the light emitting device illustrated in FIG. 9.

FIG. 9 is a plan view illustrating a light emitting device 200 according to a second embodiment. FIG. 10 is a sectional view taken along a direction of DD' of the light emitting device 200 illustrated in FIG. 9. FIG. 11 is a sectional view taken along a direction of EE' of the light emitting device 200 illustrated in FIG. 9. The same drawing reference numerals as in FIGS. 1 to 4 represent the same configuration and the aforementioned descriptions are omitted or summarized.

Referring to FIGS. 9 to 11, the light emitting device 200 includes a substrate 110, a buffer layer 115, a light emitting structure 120 divided into a plurality of light emitting regions P1 to Pn (in which n is a natural number greater than 1), a conductive layer 130, a first distributed bragg reflective layer 140-1, a first electrode unit 250, at least one connection electrode 260-1 to 260-$m$ (in which m is a natural number of 1 or more), at least one intermediate pad 282 and 284, and a second electrode unit 272.

The first electrode unit 250 is disposed on the first conductive type semiconductor layer 122 in one light emitting region (for example, P9) among the light emitting regions P1 to Pn (for example, n=9) and may contact the first conductive type semiconductor layer 122. The first electrode unit 250 may include a first pad bonded to a wire (not shown) to supply a first power. In the embodiment of FIG. 6, the first electrode unit 250 may serve as the first pad.

The second electrode unit 272 is disposed in the second conductive type semiconductor layer 126 in another light emitting region (for example, P1) among the light emitting regions P1 to Pn (for example, n=9). Also, the second electrode unit 272 may contact the second conductive type semiconductor layer 126 or the conductive layer 130.

For example, the second electrode unit 272 is disposed on the conductive layer 130 in the first light emitting region P1 among the light emitting regions connected in series, and the first electrode unit 250 may be disposed on the first conductive type semiconductor layer 122 in the last light emitting region P9. The second electrode unit 272 may include a second pad bonded to a wire to supply a second power. In another embodiment, the electrode unit may further include a branch electrode (not shown) that extends from the second pad.

The first distributed bragg reflective layer 140-1 may be disposed in the light emitting regions P1 to Pn (in which n is a natural number greater than 1) and on the boundary region S. The connection electrodes 260-1 to 260-$m$ (for example, m=8) are disposed on the first distributed bragg reflective layer 140-1 and electrically connect the light emitting regions P1 to Pn (for example, n=9) in series.

Each connection electrode (for example, 260-1) may electrically connect the first conductive type semiconductor layer 122 of one light emitting region (for example, P1) among the adjacent light emitting regions (for example, P1 and P2) to the second conductive type semiconductor layer 126 or the conductive layer 130 in the other light emitting region (for example, P2) thereof.

That is, the $k^{th}$ connection electrode 260-$k$ may electrically connect the second conductive type semiconductor layer 126 or the conductive layer 130 of the k+1$^{th}$ light emitting region to the first conductive type semiconductor layer 122 of the $k^{th}$ light emitting region. Here, 1≤k≤n−1. For example, referring to FIG. 10, the $k^{th}$ connection electrode 260-$k$ (for example, k=2) may be disposed in the $k^{th}$ light emitting region Pk (for example, k=2), the k+1$^{th}$ light emitting region (for example, k+1=3), and the boundary region S provided therebetween. Also, the $k^{th}$ connection electrode 260-$k$ (for example, k=2) may have at least one first portion (for example, 201) that passes through the first distributed bragg reflective layer 140-1 and contacts the conductive layer 130 (or second conductive type semiconductor layer 126) of the k+1$^{th}$ light emitting region (for example, P3). The first distributed bragg reflective layer 140-1 may be interposed between the light emitting structure 120 disposed on the boundary region S and the connection electrode 260-1 to 260-n (in which n is a natural number greater than 1).

In addition, the k$^{th}$ connection electrode 260-k (for example, k=2) may include at least one second portion (for example, 202) that passes through the first distributed bragg reflective layer 140-1, the conductive layer 130, the second conductive type semiconductor layer 126 and the active layer 124 of the k$^{th}$ light emitting region (for example, P2) and contacts the first conductive type semiconductor layer 122. The first distributed bragg reflective layer 140-1 may be disposed between the k$^{th}$ connection electrode 260-k (for example, k=2) and the conductive layer 130, between the second portion 202 of the k$^{th}$ connection electrode 260-k (for example, k=2) and the second conductive type semiconductor layer 126, and between the second portion 202 of the k$^{th}$ connection electrode 260-k (for example, k=2) and the active layer 124.

The intermediate pads 252 and 254 are disposed on the first conductive type semiconductor layer 122 of at least one light emitting region among the light emitting regions P1 to Pn (in which n is a natural number greater than 1). The intermediate pads 252 and 254 may be bonded to wires (not shown) to supply a first power.

As shown in FIG. 11, a part of the first conductive type semiconductor layer 122 is exposed by mesa-etching at least one of light emitting regions (for example, P2 to P12) and the intermediate pads 252 and 254 may be disposed on the exposed part of the first conductive type semiconductor layer 122.

For example, the intermediate pads 252 and 254 may be disposed on the first conductive type semiconductor layer 122 in at least one light emitting region (for example, P4 and P7) among the light emitting regions (for example, P2 to P8), other than light emitting regions (for example, P1 and P9) where the first electrode unit 250 and the second electrode unit 272 are positioned.

Figure 12:
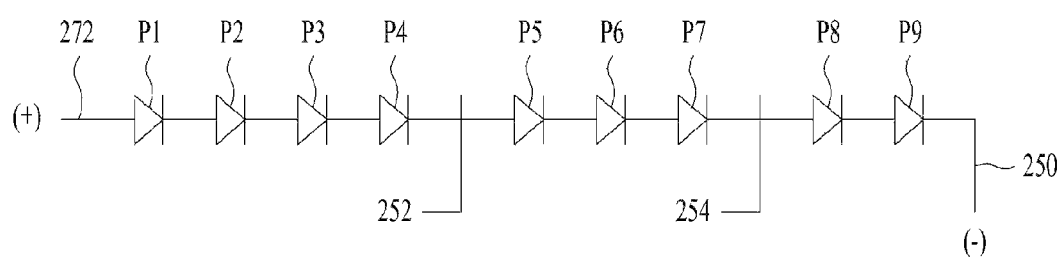
FIG. 12 is a circuit diagram of the light emitting device illustrated in FIG. 9.

FIG. 12 is a circuit diagram of the light emitting device 200 illustrated in FIG. 9. Referring to FIGS. 9 and 12, the light emitting device 200 has a common single (+) terminal, for example, a second electrode unit 272, and two or more (−) terminals, for example, a first electrode unit 250 and at least one intermediate pad 252 and 254.

Accordingly, in this embodiment, the light emitting device includes two or more (−) terminals, pads 250, 252 and 254, thus enabling use of various driving voltages and enabling control of emission of light with various brightness levels.

Figure 13:
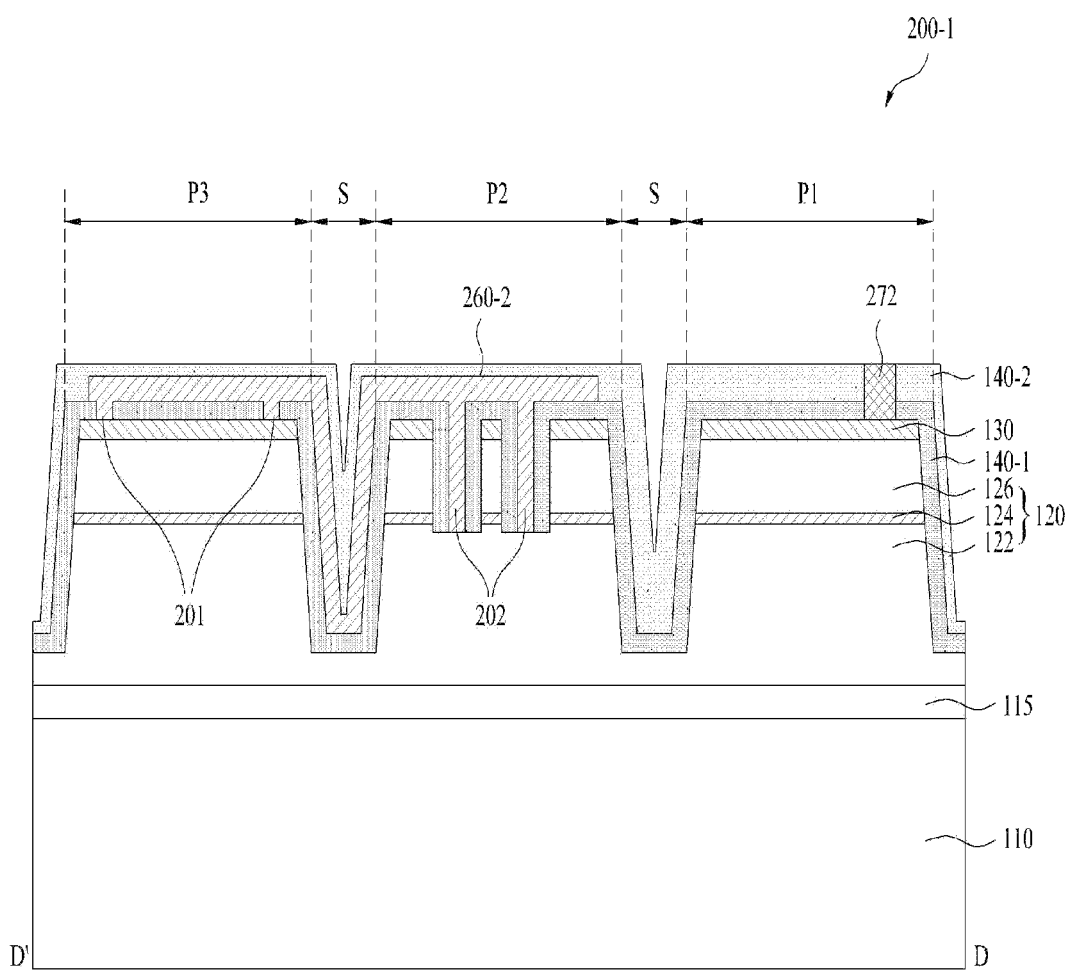
FIGS. 13 and 14 are sectional views illustrating a light emitting device according to a variation embodiment of the second embodiment.
Figure 14:
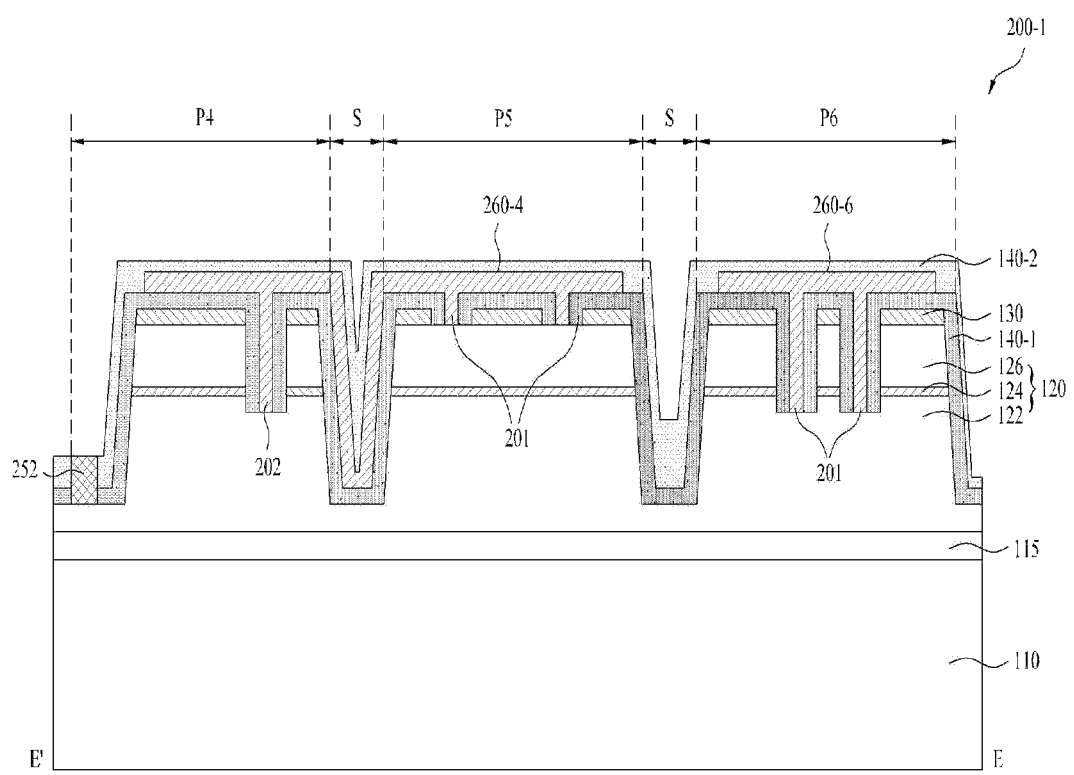

FIGS. 13 and 14 are sectional views illustrating a light emitting device according to a variation embodiment of the second embodiment. FIG. 13 is a sectional view taken along a direction of DD' of the light emitting device illustrated in FIG. 9. FIG. 14 is a sectional view taken along a direction of EE' of the light emitting device illustrated in FIG. 9.

Referring to FIGS. 13 and 14, the variation embodiment further includes a second distributed bragg reflective layer 140-2, in addition to the second embodiment. The second distributed bragg reflective layer 140-2 is disposed on the first distributed bragg reflective layer and covers connection electrodes 260-1 to 260-m (m is a natural number of 1 or more). The second distributed bragg reflective layer 140-2 may expose the first electrode unit 250, the second electrode unit 272, and the intermediate pads 252 and 254.

The second distributed bragg reflective layer 140-2 may be made of the same material as the first distributed bragg reflective layer 140-1. The second distributed bragg reflective layer 140-2 may prevent the connection electrodes 160-1 to 160-m (in which m is a natural number greater than 1) from being detached or damaged.

Figure 15:
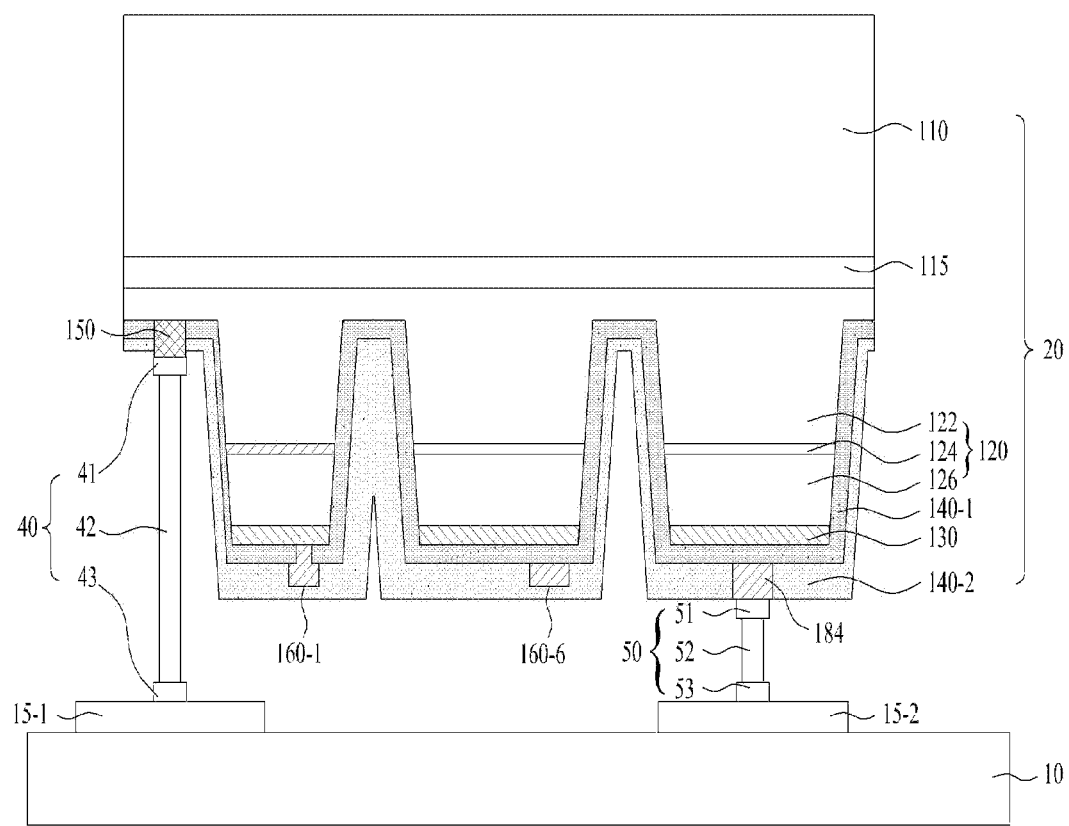
FIG. 15 is a sectional view illustrating a light emitting device package including a light emitting device according to one embodiment.

FIG. 15 is a sectional view illustrating a light emitting device package 400 including a light emitting device in accordance with one embodiment.

Referring to FIG. 15, the light emitting package 400 includes a submount 10, a light emitting device 20, a first metal layer 15-1, a second metal layer 15-2, a first bump unit 40 and a second bump unit 50.

The submount 10 mounts the light emitting device 20. The submount 10 may be realized with a package body or a printed circuit board or the like and may have various shapes enabling flip-chip bonding of the light emitting device 20.

The light emitting device 20 is disposed on the submount 10 and is electrically connected through the first bump unit 40 and the second bump unit 50 to the submount 10. Although the light emitting device 20 shown in FIG. 15 relates to the variation embodiment shown in FIG. 6, the light emitting device 20 may be the light emitting device (for example, 100, 200 or 200-1) according to other embodiments, but the disclosure is not limited thereto.

The submount 10 may be include a resin such as polyphthalamide (PPA), a liquid crystal polymer (LCP) or polyamide9T (PA9T), a metal, a photo-sensitive glass, sapphire, a ceramic, a printed circuit board or the like. However, the material for the submount 10 according to this embodiment is not limited thereto.

The first metal layer 15-1 and the second metal layer 15-2 are spaced from each other on the upper surface of the submount 10. Here, the upper surface of the submount 10 may be a surface that faces the light emitting device 20. The first metal layer 15-1 and the second metal layer 15-2 may be formed of a conductive metal such as aluminum (Al) or rhodium (Rh).

The first bump unit 40 and the second bump unit 50 are disposed between the submount 110 and the light emitting device 20. The first bump unit 40 may electrically connect the first electrode unit 150 to the first metal layer 15-1.

The second bump unit 50 may electrically connect one of the second electrode unit 170 and intermediate pads 182 and 184 to the second metal layer 15-2.

The first bump unit 40 includes a first anti-diffusion bonding layer 41, a first bumper 42 and a second anti-diffusion bonding layer 43. The first bumper 42 is positioned between the first electrode unit 150 and the first metal layer 15-1. The first anti-diffusion bonding layer 41 is positioned between the first electrode unit 150 and the first bumper 42 and adheres the first bumper 42 to the first electrode unit 150. That is, the first anti-diffusion bonding layer 41 improves adhesion strength between the first bumper 42 and the first electrode unit 150, and prevents ions present in the first bumper 42 from being permeated or diffused into the light emitting structure 20 through the first electrode unit 150.

The second anti-diffusion bonding layer 43 is disposed between the first bumper 42 and the first metal layer 15-1 and adheres the first bumper 42 to the first metal layer 15-1. The second anti-diffusion bonding layer 43 improves adhesion between the first bumper 42 and the first metal layer 15-1, and prevents ions present in the first bumper 42 from being permeated or diffused into the submount 10 through the first metal layer 15-1.

The second bump unit 50 includes a third anti-diffusion bonding layer 51, a second bumper 52 and a fourth anti-diffusion bonding layer 53. The second bumper 52 is positioned between one of the second electrode unit 170 and intermediate pads 182 and 184, and the second metal layer 15-2.

The third anti-diffusion bonding layer 51 is positioned between one of the second electrode unit 170 and intermediate pads 182 and 184, and the second bumper 52 and adheres these two elements. That is, the third anti-diffusion bonding layer 51 functions to improve adhesion strength and prevent ions present in the second bumper 52 from being permeated or diffused into the light emitting structure 20 through the second electrode unit 170 or intermediate pads 182 and 184.

The fourth anti-diffusion bonding layer 53 is disposed between the second bumper 52 and the second metal layer 15-2 and adheres the second bumper 52 to the second metal layer 15-2. The fourth anti-diffusion bonding layer 53 improves adhesion between the second bumper 52 and the second metal layer 15-2 and prevents ions present in the second bumper 52 from being permeated or diffused into the submount 10 through the second metal layer 15-2.

The first to fourth anti-diffusion bonding layers 41, 43, 51 and 53 may be formed of at least one of Pt, Ti, W/Ti and Au, or an alloy thereof. Also, the first bump 42 and the second bump 52 may contain at least one of titanium (Ti), copper (Cu), nickel (Ni), gold (Au), chromium (Cr), tantalum (Ta), platinum (Pt), and tin (Sn).

In this embodiment, the first distributed bragg reflection layer 140-1 prevents absorption and loss of light into the second electrode unit 170, the connection electrodes 160-1 to 160-$n$ (in which n is a natural number greater than 1), and the intermediate pads 182 and 184, and thereby improves light emission efficiency.

Also, in this embodiment, the second distributed bragg reflection layer 140-2 protects the connection electrodes 160-1 to 160-$m$ (in which m is a natural number of 1 or more), thus preventing the connection electrode 160-1 to 160-$m$ (in which m is a natural number of 1 or more) from being detached or damaged, when the light emitting device 20 is bonded to the submount 10.

An array of plural light emitting device packages in accordance with this embodiment may be mounted on a substrate, and optical members, such as a light guide panel, a prism sheet, a diffusion sheet, etc., may be disposed on an optical path of the light emitting device packages. The light emitting device packages, the substrate and the optical members may function as a backlight unit.

In accordance with other embodiments, the light emitting devices or the light emitting device package in accordance with the above-described embodiments may constitute a display apparatus, an indicating apparatus and a lighting system, and, for example, the lighting system may include a lamp or a streetlight.

Figure 16:
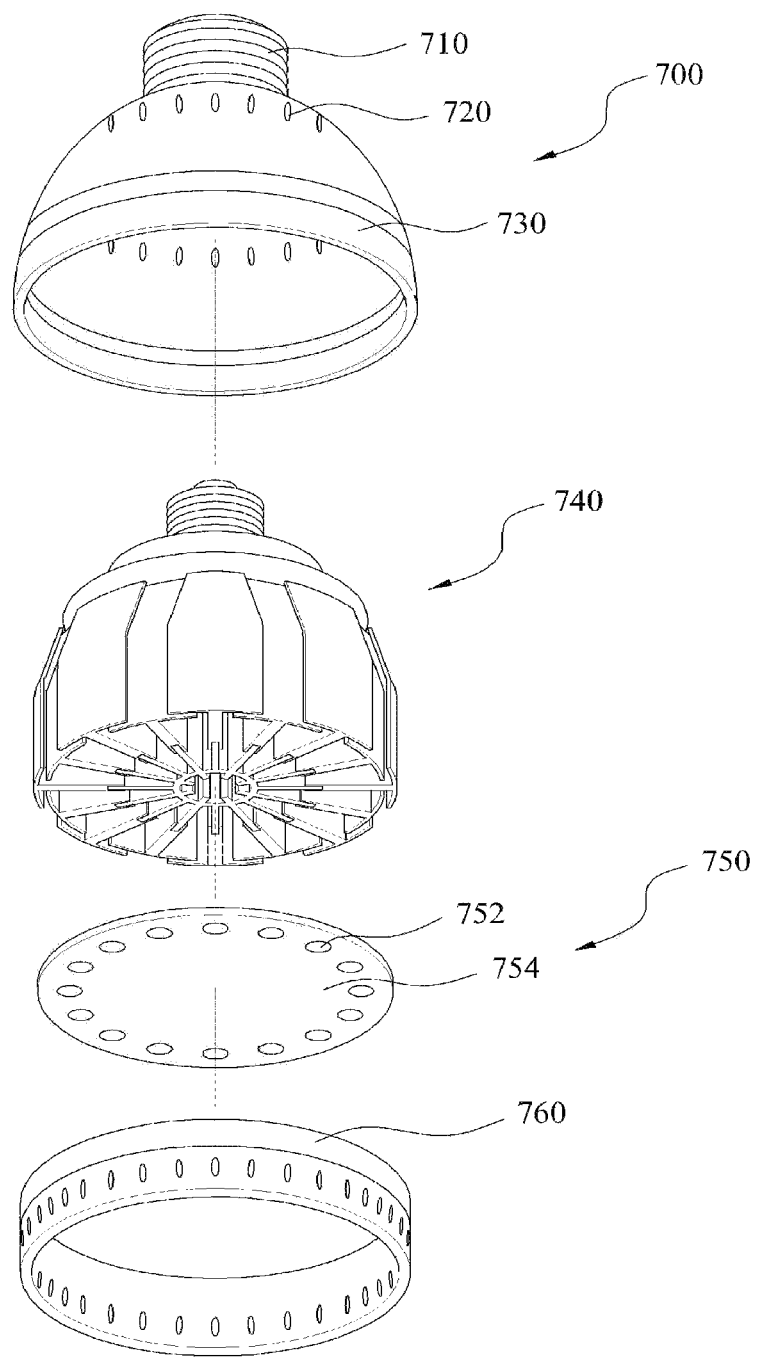
FIG. 16 is an exploded perspective view of a lighting apparatus including the light emitting device package according to one embodiment.

FIG. 16 is an exploded perspective view of a lighting apparatus including light emitting device packages in accordance with one embodiment. With reference to FIG. 16, the lighting apparatus in accordance with this embodiment includes a light source 750 to project light, a housing 700 in which the light source 750 is installed, a heat dissipation unit 740 to dissipate heat generated by the light source 750, and a holder 760 to couple the light source 750 and the heat dissipation unit 740 to the housing 700.

The housing 700 includes a socket connector 710 connected to an electrical socket (not shown) and a body 730 connected to the socket connector 710 and accommodating the light source 750. One air flow hole 720 may be formed through the body 730.

A plurality of air flow holes 720 may be provided on the body 730 of the housing 700. One air flow hole 720 may be formed, or plural air flow holes 720 may be arranged, in a radial shape or various other shapes.

The light source 750 includes a plurality of light emitting device packages 752 provided on a substrate 754. Here, the substrate 754 may have a shape which is capable of being inserted into an opening of the housing 700, and be formed of a material having high thermal conductivity so as to transfer heat to the heat dissipation unit 740, as described later. A plurality of light emitting device packages may be the light emitting device packages according to the aforementioned embodiments.

The holder 760 is provided under the light source 750. The holder 760 may include a frame and air flow holes. Further, although not shown in FIG. 12, optical members may be provided under the light source 750 so as to diffuse, scatter or converge light emitted from the light emitting device packages 752 of the light source 750.

Figure 17:
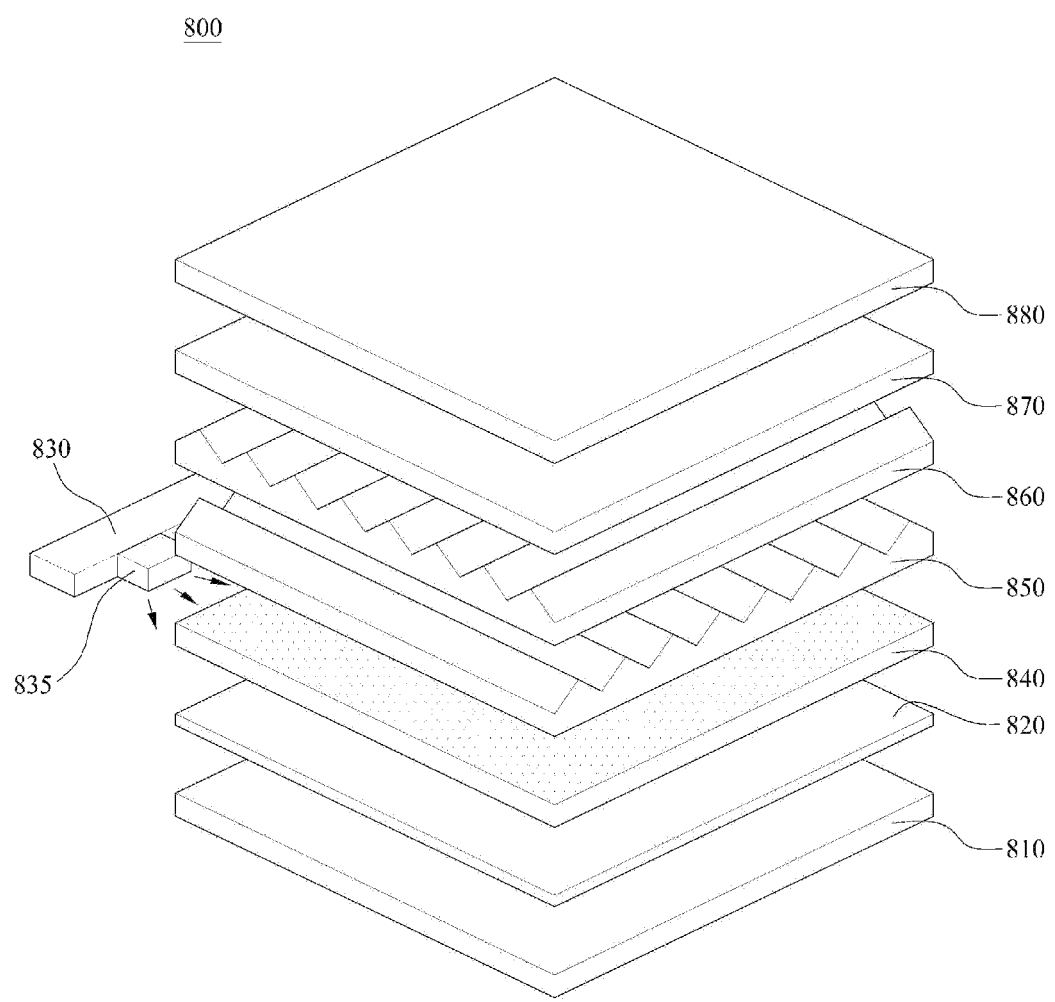
FIG. 17 illustrates a display apparatus including the light emitting device package according to one embodiment.

FIG. 17 is an exploded perspective view of a display apparatus 800 including light emitting device packages according to one embodiment.

Referring to FIG. 17, the display apparatus 800 includes a bottom cover 810, a reflective plate 820 disposed on the bottom cover 810, light emitting modules 830 and 835 to emit light, a light guide plate 840 disposed on the front surface of the reflective plate 820 to guide light emitted from the light emitting modules 830 and 835 to the front part of the display device, an optical sheet including prism sheets 850 and 860 disposed on the front surface of the light guide plate 840, a display panel 870 disposed on the front surface of the optical sheet, an image signal output circuit 872 connected to the display panel 870 to supply an image signal to the display panel 870, and a color filter 880 disposed on the front surface of the display panel 870. Here, the bottom cover 810, the reflective plate 820, the light emitting modules 830 and 835, the light guide plate 840, and the optical sheet may constitute a backlight unit.

The light emitting modules may include a light emitting device package 835 on the substrate 830. Here, the substrate 830 may be formed of PCB or the like. The light emitting device package 835 may be the light emitting device package according to the afore-mentioned embodiment.

The bottom cover 810 may accommodate components within the image display apparatus 800. The reflective plate 820 may be provided as a separate component, as shown in the drawing, or be provided by coating the rear surface of the light guide plate 840 or the front surface of the bottom cover 810 with a material having high reflectivity.

The reflective plate 820 may be formed of a material that has high reflectivity and may be useful in an ultra-thin form such as polyethylene terephthalate (PET).

The light guide plate 840 is formed of a material having a high index of refraction and high transmittance, such as polymethylmethacrylate (PMMA), polycarbonate (PC) or polyethylene (PE).

The first prism sheet 850 is formed of a light transmitting and elastic polymer on one surface of a support film, and the polymer may have a prism layer in which plural three-dimensional structures are repeated. Here, such plural patterns may be formed in a strip manner in which ridges and valleys are repeated, as shown in the drawing.

A direction of ridges and valleys formed on one surface of a support film of the second prism sheet 860 may be perpendicular to a direction of the ridges and the valleys formed on one surface of the support film of the first prism sheet 850.

This serves to uniformly distribute light transmitted from the light source module and the reflective plate 820 in all directions of the panel 870.

Although not shown, a diffusion sheet may be disposed between the light guide plate 840 and the first prism sheet 850. The diffusion sheet may be made of polyester and polycarbonate and maximizes a light projection angle of light emitted from the backlight unit through refraction and scattering. Also, the diffusion sheet may include a support layer including a light diffusion agent, and a first layer and a second layer that are formed on a light projection surface (first prism sheet direction) and a light incident surface (reflective sheet direction) and do not include a light diffusion agent.

Although this embodiment illustrates optical sheets as including the diffusion sheet, the first prism sheet 850 and the second prism sheet 860, the optical sheets may include another combination, for example, a micro lens array, a combination of a diffusion sheet and a micro lens array, or a combination of one prism sheet and a micro lens array.

As the display panel 870, a liquid crystal display panel may be provided, or other kinds of display apparatuses requiring a light source may be provided instead of the liquid crystal display panel.

As is apparent from the above description, the light emitting device and the light emitting device package according to the embodiments increase a light emitting region, thus improving light emission efficiency and preventing electrodes from being detached or damaged.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a light emitting structure comprising a plurality of light emitting regions comprising a first semiconductor layer, an active layer and a second semiconductor layer;
   a first distributed bragg reflective layer disposed on the light emitting regions;
   a first electrode unit disposed on the first semiconductor layer in one of the light emitting regions;
   a second electrode unit disposed on the second semiconductor layer in another of the light emitting regions;
   an intermediate pad disposed on the first semiconductor layer or the second semiconductor layer in at least still another of the light emitting regions; and
   a connection electrode disposed on the first distributed bragg reflective layer,
   wherein the connection electrode connects two adjacent light emitting regions such that the two adjacent light emitting regions are connected in series.

2. The light emitting device according to claim 1, wherein the connection electrode electrically connects the first semiconductor layer of one of the two adjacent light emitting regions to the second semiconductor layer of the other thereof.

3. The light emitting device according to claim 1, wherein each of the first electrode unit and the second electrode unit comprises a pad that receives a power.

4. The light emitting device according to claim 1, wherein the intermediate pad is electrically connected to the connection electrode disposed in a same light emitting region.

5. The light emitting device according to claim 4, wherein the intermediate pad is separated from the connection electrode, on the first distributed bragg reflective layer in the same light emitting region.

6. The light emitting device according to claim 4, wherein the intermediate pad is integrated with the connection electrode on the first distributed bragg reflective layer in the same light emitting region, and
   wherein the intermediate pad is disposed on the second semiconductor layer.

7. The light emitting device according to claim 2, wherein the connection electrode comprises a first portion that passes through the first distributed bragg reflective layer and contacts the second semiconductor layer in one of the adjacent light emitting regions.

8. The light emitting device according to claim 7, wherein the connection electrode further comprises a second portion that passes through the first distributed bragg reflective layer, the second semiconductor layer and the active layer, and contacts the first semiconductor layer in the other of the adjacent light emitting regions,
   wherein the first distributed bragg reflective layer is disposed between the second portion and the second semiconductor layer, and between the second portion and the active layer.

9. The light emitting device according to claim 8, further comprising:
   a substrate disposed under the light emitting structure; and
   a conductive layer disposed between the light emitting region and the first distributed bragg reflective layer.

10. The light emitting device according to claim 9, wherein the second portion of the connection electrode passes through the conductive layer.

11. The light emitting device according to claim 10, wherein the first distributed bragg reflective layer is disposed between the connection electrode and the conductive layer.

12. The light emitting device according to claim 1, further comprising:
    a second distributed bragg reflective layer disposed on the first distributed bragg reflective layer, the second distributed bragg reflective layer covering the connection electrode.

13. The light emitting device according to claim 12, wherein the second distributed bragg reflective layer exposes the first electrode unit, the second electrode unit and the intermediate pad.

14. The light emitting device according to claim 12, wherein each of the first distributed bragg reflective layer and the second distributed bragg reflective layer comprises an insulator and comprises at least one first layer and at least one second layer alternately stacked at least one time, wherein a refractive index of the first layer is different from that of the second layer.

15. The light emitting device according to claim 1, wherein the first electrode unit is configured to receive a first power and at least one of the intermediate pad and the second electrode unit is configured to receive a second power, and
    wherein the intermediate pad is disposed on the second semiconductor layer.

16. The light emitting device according to claim 1, wherein at least one of the intermediate pad and the first electrode unit is configured to receive a first power and the second electrode unit is configured to receive a second power, and wherein the intermediate pad is disposed on the first semiconductor layer.

17. A light emitting device, comprising:
a light emitting structure comprising a plurality of light emitting regions comprising a first semiconductor layer, an active layer and a second semiconductor layer;
a substrate disposed under the light emitting structure;
a first distributed bragg reflective layer disposed on the light emitting regions;
a conductive layer disposed between the light emitting regions and the first distributed bragg reflective layer;
a first electrode unit disposed on the first semiconductor layer in one of the light emitting regions;
a second electrode unit disposed on the second semiconductor layer in another of the light emitting regions;
an intermediate pad disposed on the first semiconductor layer or the second semiconductor layer in at least still another of the light emitting regions; and
a connection electrode disposed on the first distributed bragg reflective layer,
wherein the connection electrode connects two adjacent light emitting regions such that the two adjacent light emitting regions are connected in series.

18. A light emitting device package, comprising:
a submount;
a first metal layer and a second metal layer spaced from each other on the submount;
the light emitting device disposed on the submount; and
a first bump unit and a second bump unit to electrically connect the light emitting device to the submount,
wherein the light emitting device, comprising:
a light emitting structure comprising a plurality of light emitting regions comprising a first semiconductor layer, an active layer and a second semiconductor layer;
a first distributed bragg reflective layer disposed on the light emitting regions;
a first electrode unit disposed on the first semiconductor layer in one of the light emitting regions;
a second electrode unit disposed on the second semiconductor layer in another of the light emitting regions;
an intermediate pad disposed on the first semiconductor layer or the second semiconductor layer in at least still another of the light emitting regions; and
a connection electrode disposed on the first distributed bragg reflective layer,
wherein the connection electrode connects two adjacent light emitting regions such that the two adjacent light emitting regions are connected in series, and
wherein the first bump unit electrically connects the first metal layer to the first electrode unit of the light emitting device, and the second bump unit electrically connects the second metal layer to one of the second electrode unit and the intermediate pad of the light emitting device.

19. The light emitting device package according to claim 18, wherein the first bump unit comprises:
a first bumper disposed between the first metal layer and the first electrode unit;
a first anti-diffusion bonding layer disposed between the first bumper and the first electrode unit; and
a second anti-diffusion bonding layer disposed between the first bumper and the first metal layer, and
the second bump unit comprises:
a second bumper disposed between the second metal layer and one of the second electrode unit and the intermediate pad;
a third anti-diffusion bonding layer disposed between the second bumper, and one of the second electrode unit and the intermediate pad; and
a fourth anti-diffusion bonding layer disposed between the second bumper and the second metal layer.

20. The light emitting device package according to claim 18, further comprising:
a second distributed bragg reflective layer disposed on the first distributed bragg reflective layer, the second distributed bragg reflective layer covering the connection electrode.

* * * * *